US012615788B2

(12) United States Patent
Werkman et al.

(10) Patent No.: US 12,615,788 B2
(45) Date of Patent: Apr. 28, 2026

(54) UTILIZATION OF SACRIFICIAL MATERIAL FOR CURRENT ELECTRODE FORMATION

(71) Applicant: NXP B.V., Eindhoven (NL)

(72) Inventors: Ronald Willem Arnoud Werkman, Groesbeek (NL); Johannes Josephus Theodorus Marinus Donkers, Valkenswaard (NL); Petrus Hubertus Cornelis Magnee, Malden (NL)

(73) Assignee: NXP B.V., Eindhoven (NL)

( * ) Notice: Subject to any disclaimer, the term of this patent is extended or adjusted under 35 U.S.C. 154(b) by 447 days.

(21) Appl. No.: 18/458,235

(22) Filed: Aug. 30, 2023

(65) Prior Publication Data

US 2025/0081486 A1 Mar. 6, 2025

(51) Int. Cl.
H10D 10/01 (2025.01)
H10D 64/01 (2025.01)

(52) U.S. Cl.
CPC ........... H10D 10/021 (2025.01); H10D 64/01 (2025.01)

(58) Field of Classification Search
CPC .... H10D 10/021; H10D 64/01; H10D 10/891; H10D 10/821; H10D 62/136; H10D 62/137; H10D 10/041
See application file for complete search history.

(56) References Cited

U.S. PATENT DOCUMENTS 7,456,071 B2 11/2008 Marty et al.
7,906,403 B2 3/2011 Donkers et al.

7,956,399 B2 6/2011 Van Noort et al.
9,224,634 B2 12/2015 Sonsky
2005/0151225 A1* 7/2005 Adam ................... H10D 10/021
438/320
2005/0212087 A1* 9/2005 Akatsu ................. H10D 10/021
257/E29.034
2005/0236647 A1* 10/2005 Khater ................. H10D 64/231
257/E29.124
2011/0309471 A1* 12/2011 Camillo-Castillo .........................
H10D 10/054
257/E29.174
2013/0001647 A1 1/2013 Adler
2015/0357447 A1* 12/2015 Adkisson ............. H10D 10/021
257/586
2016/0087068 A1* 3/2016 Cai ........................ H10D 10/60
257/526
2018/0240897 A1* 8/2018 Liu ...................... H10D 10/861
2018/0286968 A1* 10/2018 Jain ...................... H10D 10/40
2021/0257358 A1 8/2021 Magnee et al.
(Continued)

OTHER PUBLICATIONS

Saarnilehto, E., "Local buried oxide technology for HV transistors integrated in CMOS", Proceedings of the 19th International Symposium on Power Semiconductor Devices & ICs, May 27-30, 2007.
(Continued)

*Primary Examiner* — Syed I Gheyas
(74) *Attorney, Agent, or Firm* — David G. Dolezal

(57) ABSTRACT

A process for making a transistor that includes removing a sacrificial material under a base layer that includes dopants for an intrinsic base of a transistor. After the removal of the sacrificial layer to form a cavity directly under the base layer, a semiconductor material is formed in the cavity. The semiconductor layer includes dopants for a current electrode of the transistor that is located directly under the intrinsic base of the transistor.

20 Claims, 11 Drawing Sheets

(56) References Cited

U.S. PATENT DOCUMENTS

| 2023/0087058 A1 | 3/2023 | Pandey et al. |
| 2023/0223463 A1 | 7/2023 | Holt et al. |
| 2023/0231041 A1 | 7/2023 | Pandey et al. |

OTHER PUBLICATIONS

Van Noort, W., "BiCMOS Technology Improvements for Microwave Application", 2008 IEEE Bipoler/BiCMing, Circuits and Technology Meeting, Oct. 13-15, 2023.

* cited by examiner

UTILIZATION OF SACRIFICIAL MATERIAL FOR CURRENT ELECTRODE FORMATION

BACKGROUND OF THE INVENTION

Field of the Invention

This invention relates in general to transistors and more specifically to the utilization of sacrificial material for the formation of current electrodes of a transistor.

Description of the Related Art

Some transistors such as bipolar transistors include current electrodes such for receiving and providing current to be controlled by the transistor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of at least one mode for carrying out the invention. The description is intended to be illustrative of the invention and should not be taken to be limiting.

Disclosed herein is a process for making a transistor that includes removing a sacrificial material under a base layer that includes dopants for an intrinsic base of a transistor. After the removal of the sacrificial layer to form a cavity directly under the base layer, a semiconductor material is formed in the cavity. The semiconductor layer includes dopants for a current electrode of the transistor that is located directly under the intrinsic base of the transistor. In some embodiments, the semiconductor material is also formed over the intrinsic base during the same process as used to form the semiconductor material in the cavity. The dopants of the semiconductor material formed over the intrinsic base include dopants for a second current electrode.

Some types of bipolar transistors, such as heterojunction bipolar transistors (HBTs) can be used for high speed switching applications. HBTs typically implement different semiconductor material types for the emitter and base regions, creating a heterojunction. Some HBTs can handle signals of very high frequencies, up to several hundred GHz. HBTs can be used in radio-frequency (RF) systems and in applications requiring high power efficiency, such as in RF power amplifiers for cellular phones.

Some HBTs and other high performance transistors may require steep dopant transition profiles towards the intrinsic base to obtain minimal switching times during operation. However, exposure to high temperatures (e.g., >850 C) during wafer processing can cause dopants in a current electrode region to diffuse, thereby decreasing the steepness of the current-electrode dopant transition profile.

In some embodiments, removing a sacrificial layer to form a cavity under a base region and then forming semiconductor material with current electrode dopants in the cavity may provide for a method where the current electrode dopants are not subject to high processing temperatures which can cause unwanted diffusion of the dopants. Consequently, such a process may lead to improved transistor performance. Furthermore, providing a current electrode with a steep dopant transition profile may enable the use of a thinner current electrode region. Providing a thinner current electrode region with may lead to a shorter carrier transit time, increased transistor switching speed, and a reduced chance of current avalanche and voltage breakdown. Also such a process may result in a reduced amount of selective ion implantation operations.

Figure 1:
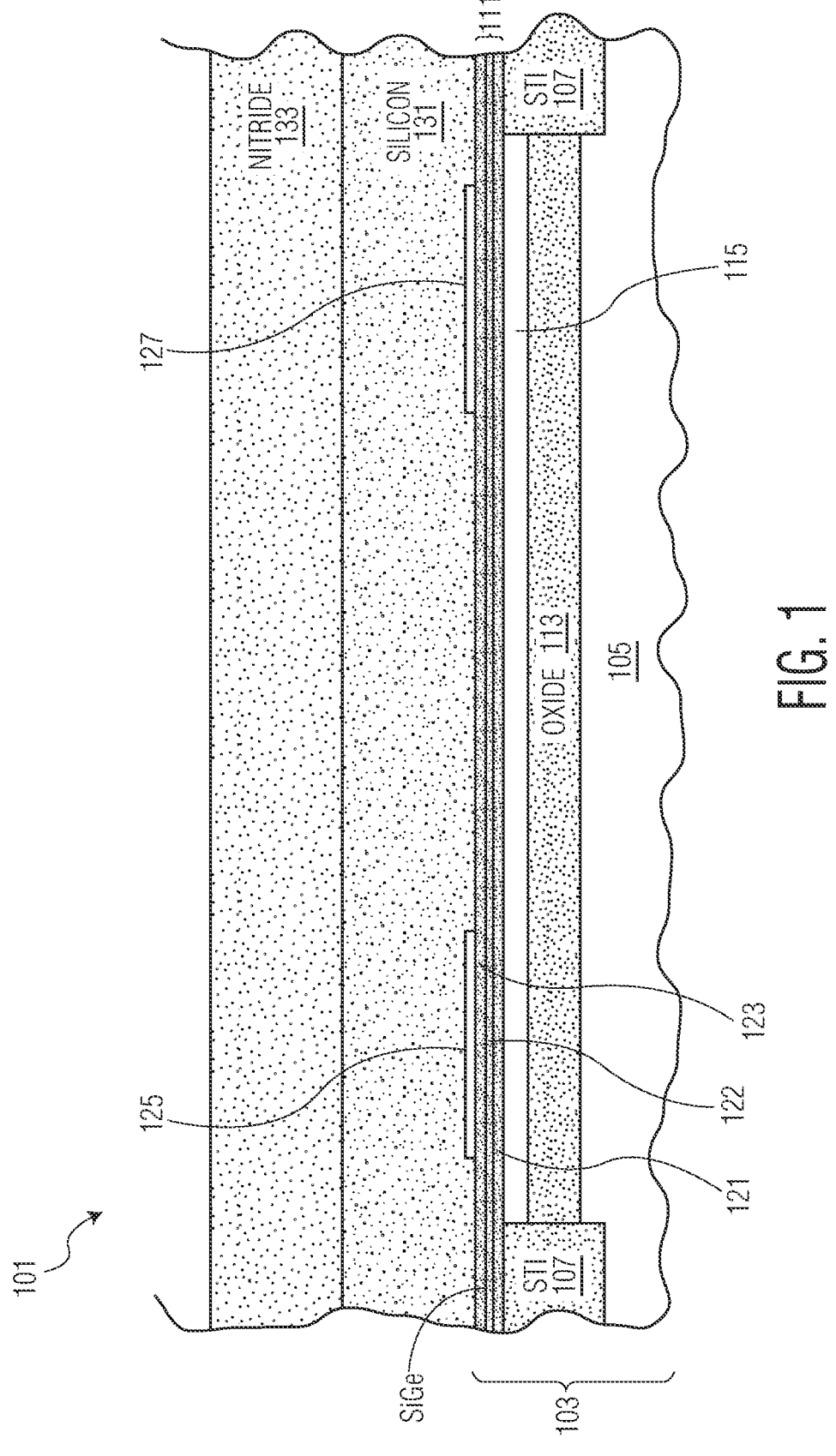
FIGS. 1-8 are partial cutaway side views of a wafer during various stages in the manufacture of a semiconductor device according to one embodiment of the present invention.

FIG. 1 is a partial cutaway side view of a wafer 101 according to one embodiment of the present invention. Wafer 101 includes a substrate 103. Substrate 103 includes a substrate layer 105 that in one embodiment, is made of monocrystalline silicon, but may be of other types of semiconductor materials such as SiGe, gallium nitride, or other III-V semiconductor materials.

Substrate 103 includes a buried oxide layer 113 that is surrounded by a shallow trench isolation structure (STI) 107. In one embodiment, buried oxide layer 113 has a thickness of less than 100 nm, but may be of thicker in other embodiments.

In the embodiment shown, layer 113 is characterized as a local buried oxide (LOBOX) that does not extend across wafer 101. In one embodiment, layer 113 is formed by the removal of a sacrificial buried SiGe layer (not shown) in substrate 103 to form a cavity that was subsequently filled with the oxide of layer 113. However, layer 113 can be formed by other LOBOX processes in other embodiments. In other embodiments, wafer 101 may be a semiconductor on insulator (SOI) wafer where oxide layer 113 extends across wafer 101. In other embodiments, layer 113 may be made of other types of sacrificial material.

Layer 115 is located above layer 113. In one embodiment, layer 115 is made of monocrystalline silicon and has a thickness of less than 50 nm. However, layer 115 maybe of other thicknesses and/or made of other materials (e.g., SiGe, GaN, other III-V semiconductor materials) in other embodiments. In some embodiments, layer 115 is etched to reduce its thickness prior to forming subsequent layers.

Layer 111 is formed on layer 115 and STI 107. In one embodiment, layer 111 is formed by an epitaxial process where portions of layer 111 formed on monocrystalline silicon layer 115 are monocrystalline and portions formed on STI 107 are polycrystalline or amorphous.

During the epitaxial process for forming layer 111, the precursor materials are adjusted to first form a silicon layer 121, a silicon germanium layer 122, and then a capping silicon layer 123. In one embodiment, layers 121, 122, and 123 each have a thickness of 10 nm, but may have other thicknesses in other embodiments.

In one embodiment, layers 122 and 123 are doped with a base dopant (e.g., boron for an NPN bipolar transistor) and layer 122 is doped with carbon. See the text regarding FIG. 10 below for a further discussion of the doping profile of layer 111 according to one embodiment. Layer 111 may have other configurations, be formed of other materials, include other dopants, and/or be formed by other processes in other embodiments.

A thin oxide layer (not shown) is formed over layer 111 and patterned to form emitter window etch stops 125 and 127 at the locations of two subsequently formed transistors. Afterwards, a layer 131 of silicon is formed over wafer 101 (e.g., by an epitaxial growth process) followed by a layer 133 of nitride. Layer 131 will be used to form linking base structures for the subsequently formed transistors. In one embodiment, layers 131 and 133 each have thicknesses of 100 nm, but may have other thicknesses in other embodiments.

Figure 2:
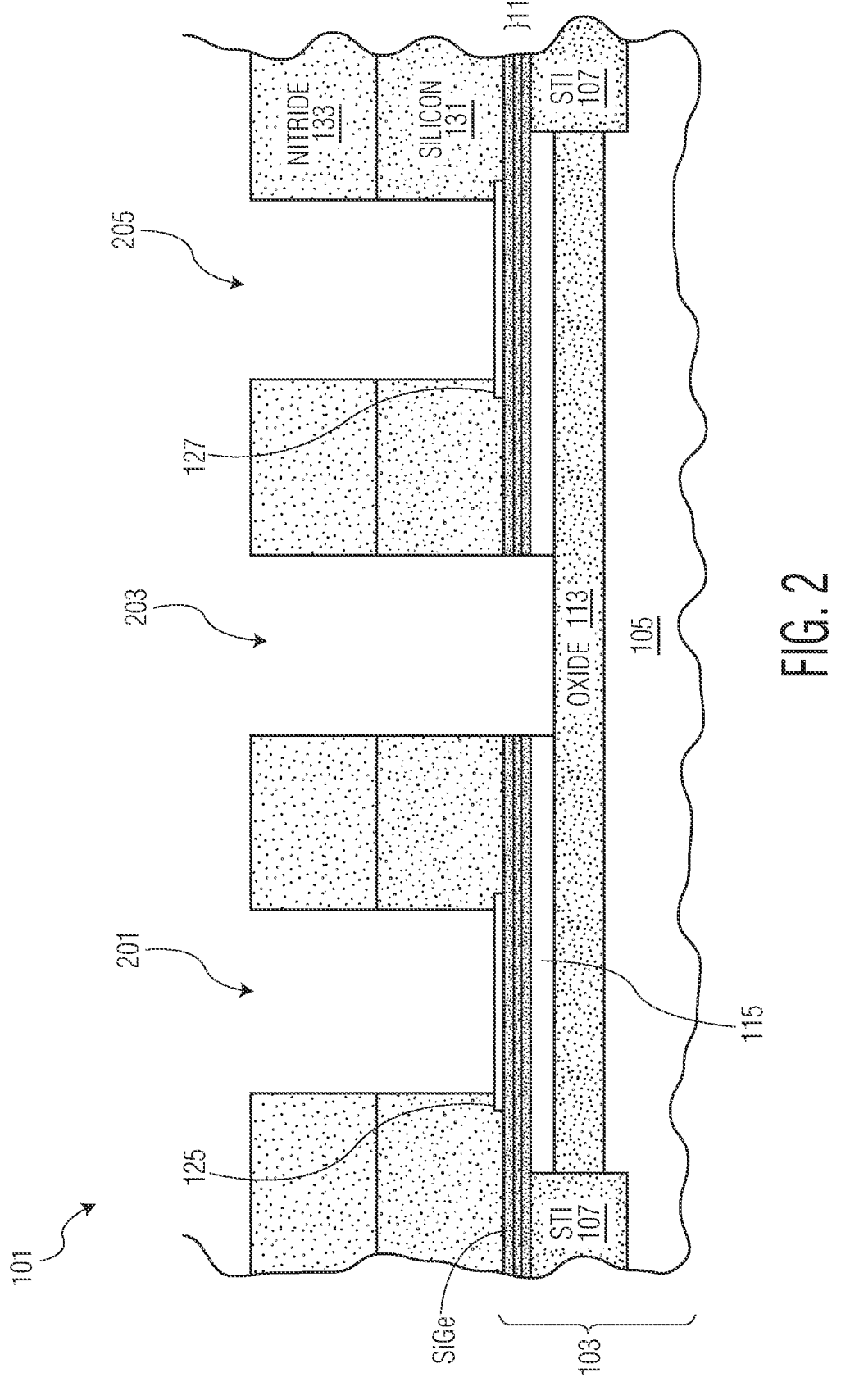

FIG. 2 is a partial cutaway side view of wafer 101 after emitter window openings 201 and 205 are formed in layers 133 and 131 to expose etch stops 125 and 127 and collector contact opening 203 is formed in layers 133, 131, 111, and 115 to expose layer 113. In one embodiment, these openings are formed by forming a photolithographic etch mask (not shown) and etching the layers with the appropriate etch chemistries. In other embodiments, openings 201 and 205 may be formed at a separate time from opening 203.

Figure 3:
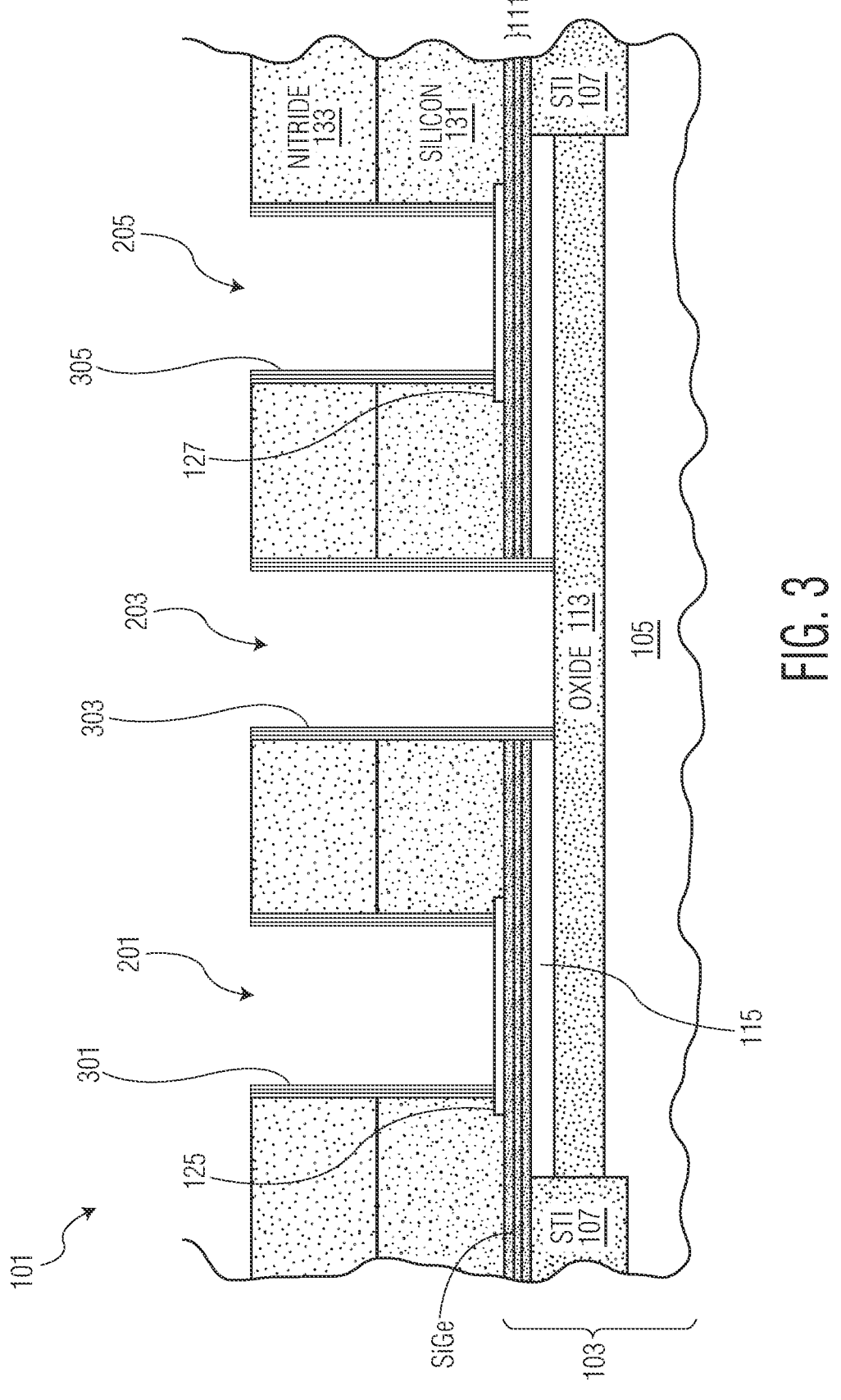

FIG. 3 is a partial cutaway side view of wafer 101 after side wall spacers 301, 303, and 305 are formed on the sidewalls of openings 201, 203, and 205, respectively. In the embodiment shown, sidewall spacers 301, 303, and 305 are formed by depositing an oxide layer, a nitride layer, and then a subsequent oxide layer (none shown) over wafer 101, where the three layers are anisotropically etched to remove portions of the three layers on horizontal surfaces. However, side wall spacers can be formed by different processes and/or of different materials in other embodiments.

Figure 4:
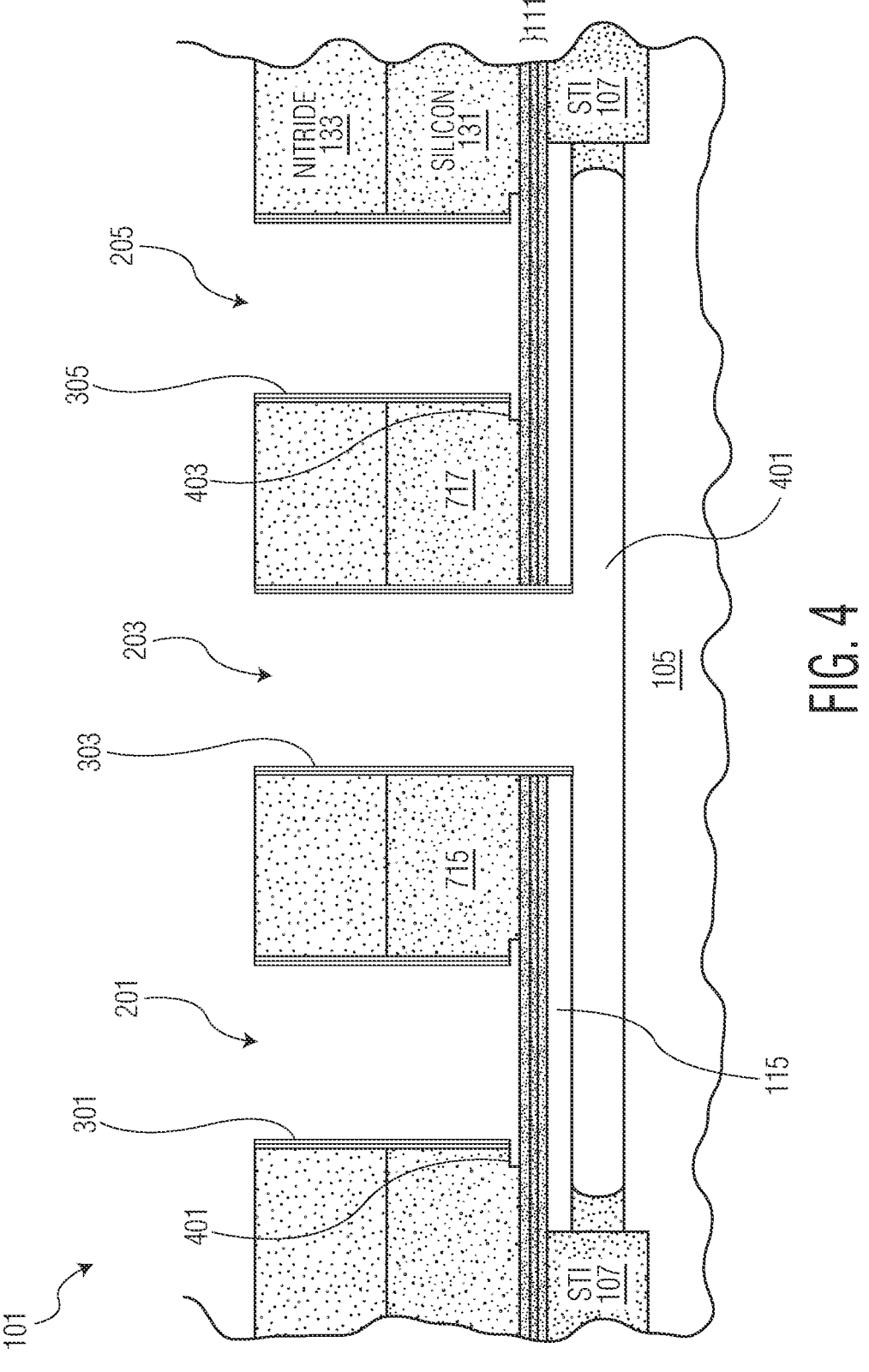

FIG. 4 is a partial cutaway side view of wafer 101 after etch stops 125 and 127 have been removed to form cavities 401 and 403, respectively, and a portion of oxide layer 113 is removed to form cavity 401. Cavity 401 extends directly under openings 201 and 205. In one embodiment, the oxide of etch stops 125 and 127 and the oxide of layer 113 are removed with a timed isotropic oxide etch with an etch chemistry that is selective to nitride and silicon. During the removal of etch stops 125 and 127 and layer 113, the outer oxide layers of spacers 301, 303, and 305 are removed, leaving these spacers with just an oxide layer and a nitride layer. In one embodiment, the oxide is etched with a wet etch. In another embodiment, the oxide is etched with a vapor phase HF etch. Because an isotropic etch is used, cavity 401 is symmetric around opening 203. In other embodiments, etch stops 125 and 127 may be removed at different times from oxide layer 113. Although in the embodiment shown, cavity 401 extends under two emitter openings 201 and 205, in other embodiments, cavity 401 may extend under only one emitter opening or under more than two emitter openings.

Figure 5:
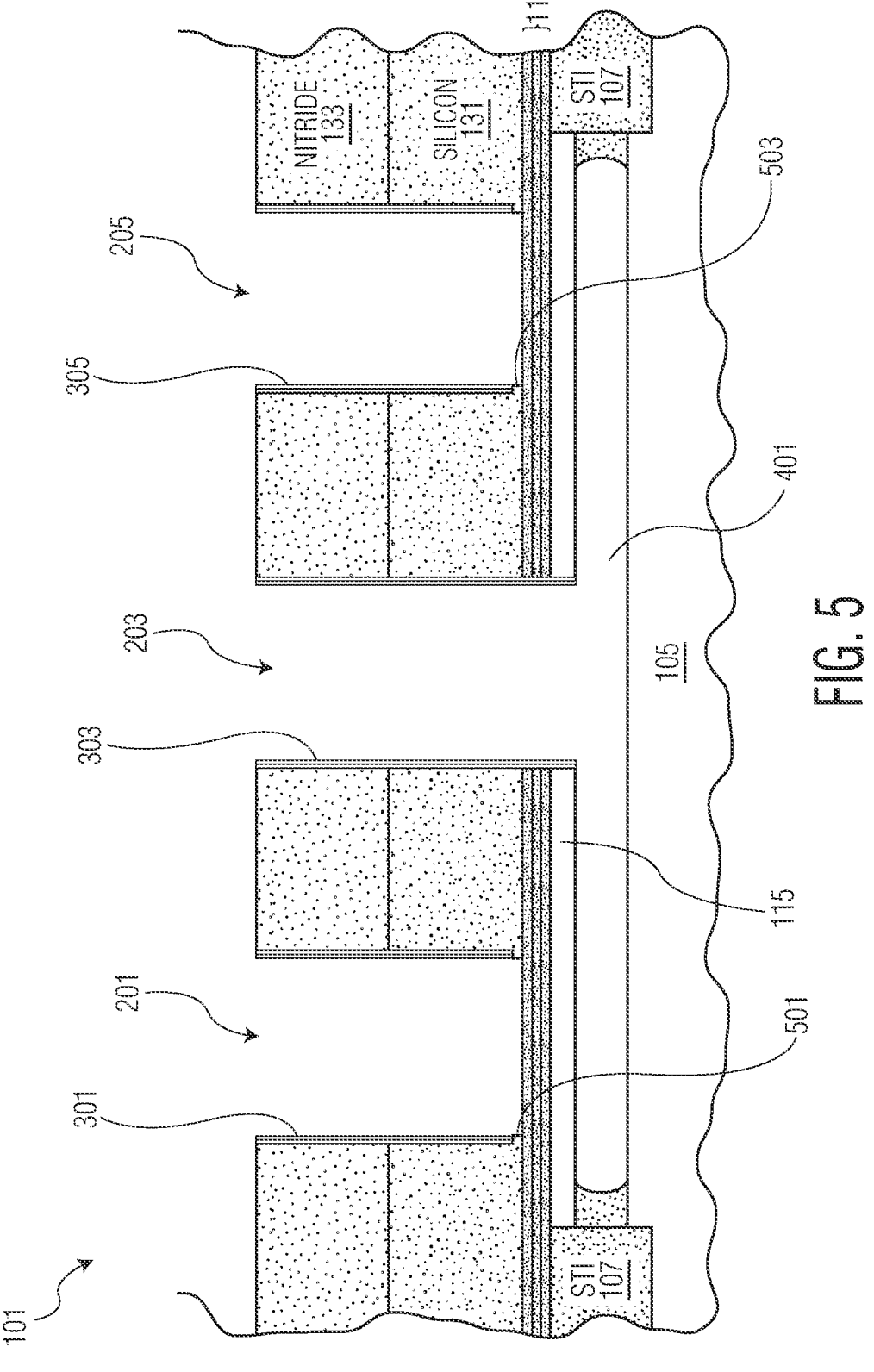

FIG. 5 is a partial cutaway side view of wafer 101 after wafer 101 is subject to a hydrogen sealing process to fill cavities 401 and 403 with silicon portions 501 and 503, respectively. In one embodiment of a hydrogen sealing process, silicon portions 501 and 503 are formed by subjecting wafer 101 to a low temperature anneal in a hydrogen ambient, which facilitates silicon atom mobility from silicon layer 131 to fill cavities 401 and 403 with silicon. Spacers 301, 303, and 305 protect silicon migration from other portions of the side walls of layer 131.

Figure 6:
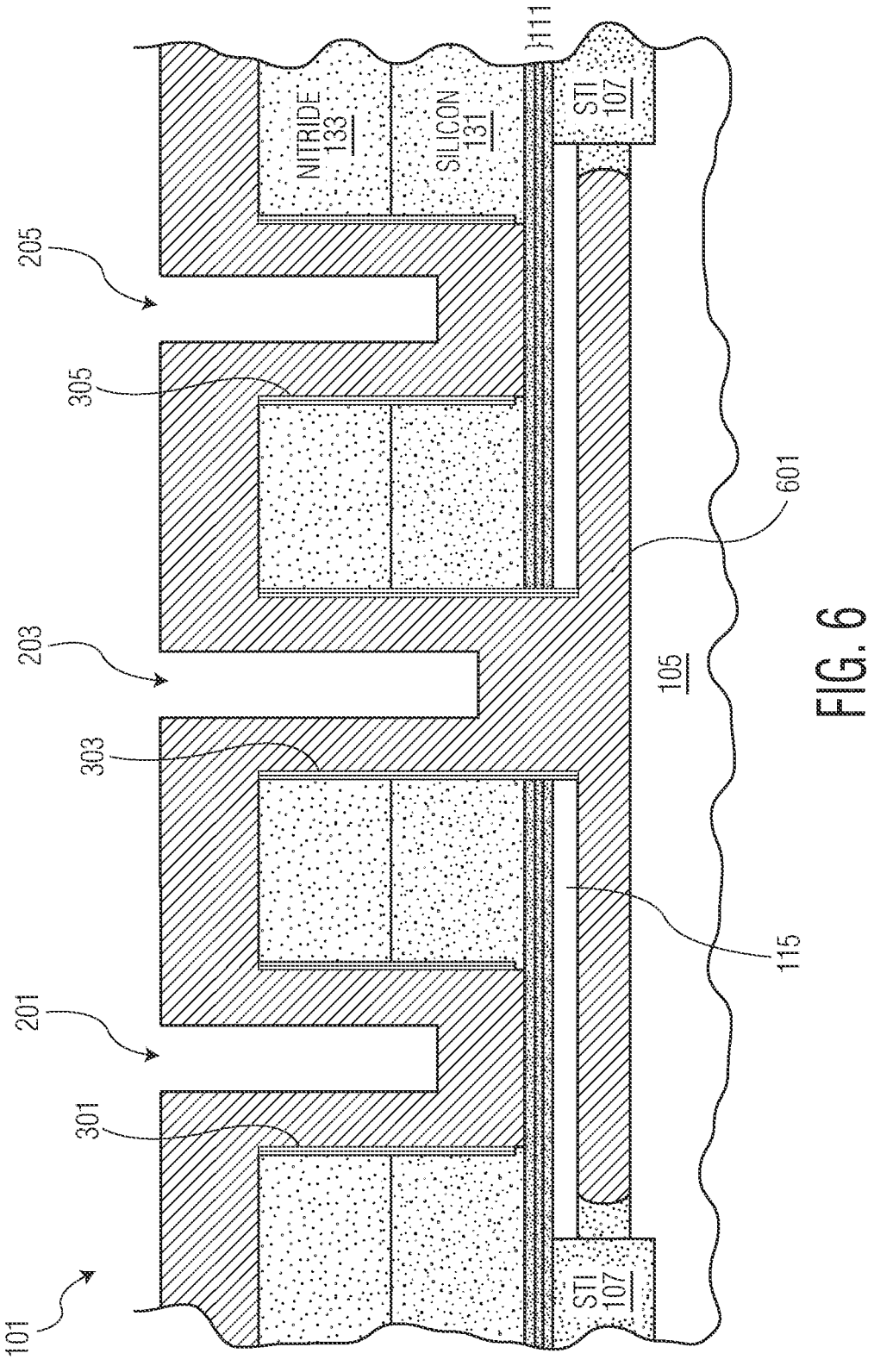

FIG. 6 is a partial cutaway side view of wafer 101 after silicon layer 601 is formed from an epitaxial process to cover wafer 101 and to fill cavity 401 and partially fill openings 201, 203 and 205. As part of the epitaxial growth process, the portions of layer 601 formed on semiconductor material (on top of layer 105, on the underneath side of layer 115 and on top of layer 111) will be monocrystalline. The portions formed on the dielectrics (on sidewalls 301, 303 and 305 and on nitride layer 133) will be amorphous or polycrystalline.

Layer 601 is formed in-situ doped with conductivity dopants for the emitter and collector regions of subsequently formed bipolar transistors (831 and 833 of FIG. 8). In one embodiment where the subsequently formed transistors are NPN bipolar transistors, layer 601 is formed with N-type dopants (e.g., phosphorus, arsenic) for providing the conductivity dopants for the emitters and collectors. In one embodiment, the doping concentration of the N-type dopants is around $1\ e^{20}\ cm^{-3}$, but may be of other concentrations in other embodiments. In other embodiments, openings 201, 203, and 205 may be completely filled with silicon. In other embodiments, layer 601 may be formed of other types of semiconductor materials. In one embodiment, the epitaxial process is a chemical vapor deposition process, but may be of other types of epitaxial processes in other embodiments. In one embodiment, the thickness of oxide layer 113 is slightly less than two times the horizontal thickness of layer 601.

Figure 7:
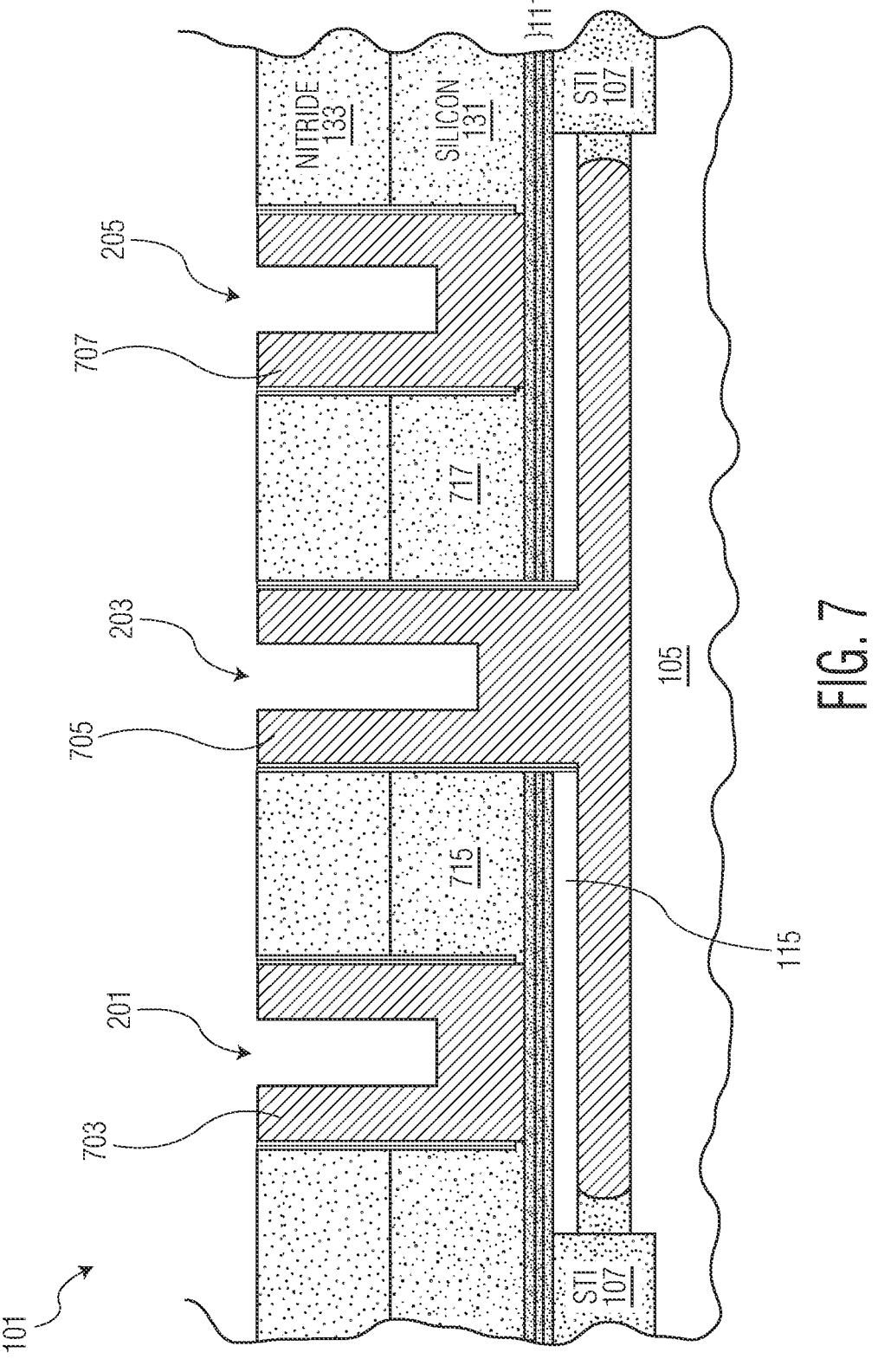

FIG. 7 is a partial cutaway side view of wafer 101 after wafer 101 has been planarized (e.g., by a CMP process) to remove portions of layer 601 on top of nitride layer 133 so as to separate layer 601 into emitter structures 703 and 707 and collector structure 705. In some embodiments, prior to the planarization process, wafer 101 is covered with a blanket oxide layer (not shown) so as to fill the remaining portions of openings 201, 203, and 205. After planarization, the oxide is removed. Separating the emitter and collector structures by planarization provides for a simplified process for forming the emitter and collector structures with the same semiconductor growth process.

Figure 8:
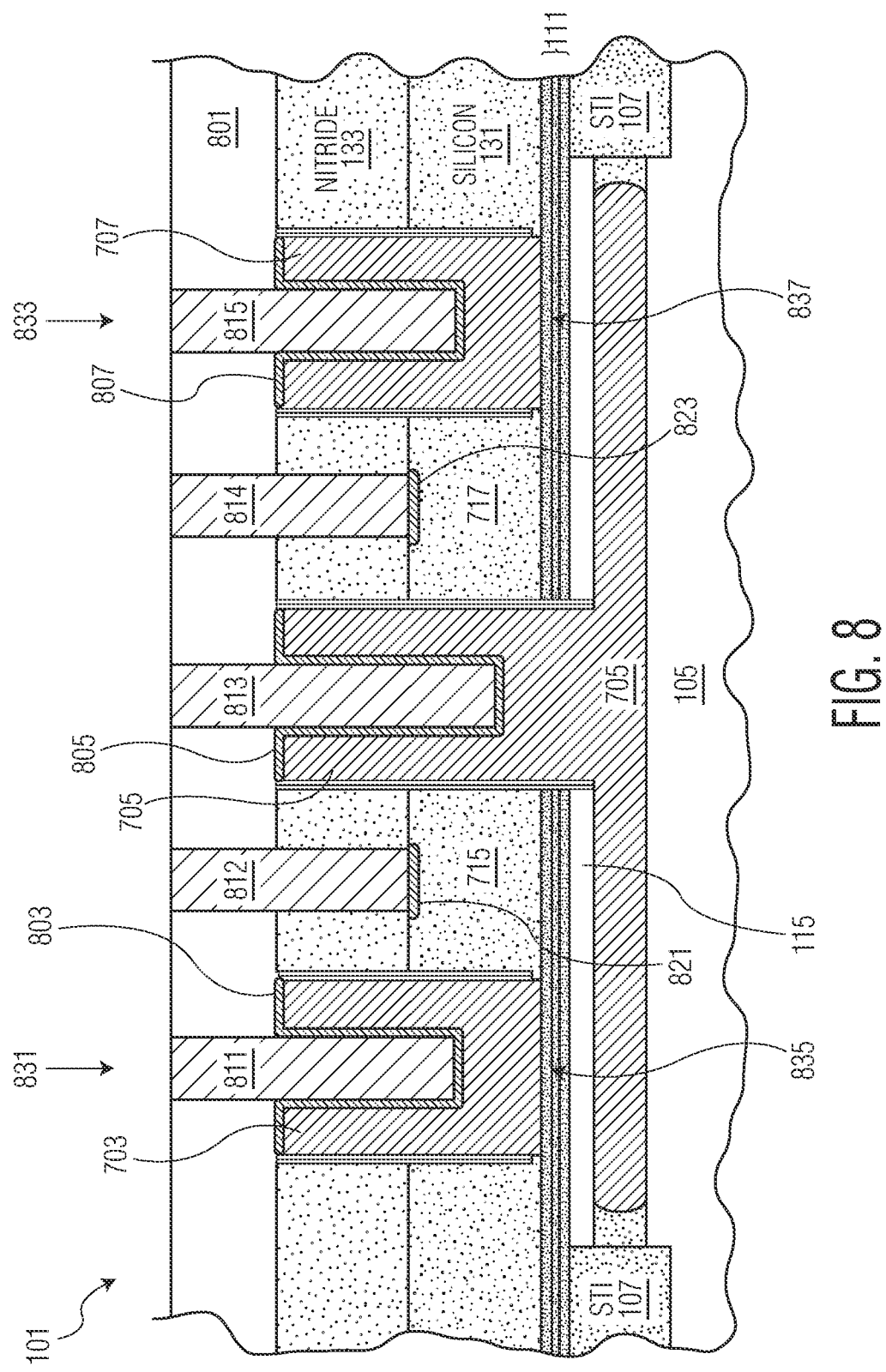

FIG. 8 is a partial cutaway side view of wafer 101 after a silicides and contacts are formed for the transistor electrodes. After the stage of FIG. 7, nitride layer 133 is patterned to form openings in layer 133 for the base contacts (812 and 814). The openings are formed by an anisotropic etch of layer 133 that stops on the top of silicon base linking structures 715 and 717 of silicon layer 131.

After the forming of openings to expose base linking structures 715 and 717, a silicidation process is performed to form emitter silicide 803, base silicide 821, collector silicide 805, base silicide 823, and emitter silicide 807. In one embodiment of a silicidation process, a metal (e.g., cobalt, nickel, titanium) is deposited over wafer 101 and then heated (e.g., to 850 C) where the metal reacts with exposed portions of silicon to form a silicide. The unreacted metal is then removed from wafer 101.

After silicide formation, a dielectric layer 801 is formed over wafer 101 e.g., by a TEOS process. Layer 801 is then patterned to form openings to expose silicides 803, 821, 805, 823, and 807. Afterwards, contact material is formed over wafer 101 and planarized to form contacts 811-815 in the openings of layer 801 that contact silicides 803, 821, 805, 823, and 807, respectively. In one embodiment, contacts 811-815 are made of tungsten with a titanium liner that is formed prior to depositing the tungsten. However, contacts 811-815 may be made of other materials and/or formed by other processes in other embodiments.

Prior to silicidation, wafer 101 is annealed to activate the dopants in base layer 111, emitter structures 703 and 705, and collector structures 705. In one embodiment, the anneal process involves heating the wafer to a high temperature (e.g., 1050 C) for a short period of time where the dopants move to substitutional lattice sites in the semiconductor material. During activation, dopants may diffuse to different layers. See FIG. 11 and the accompanying text below regarding the diffusion of dopants after the anneal process.

Figure 10:
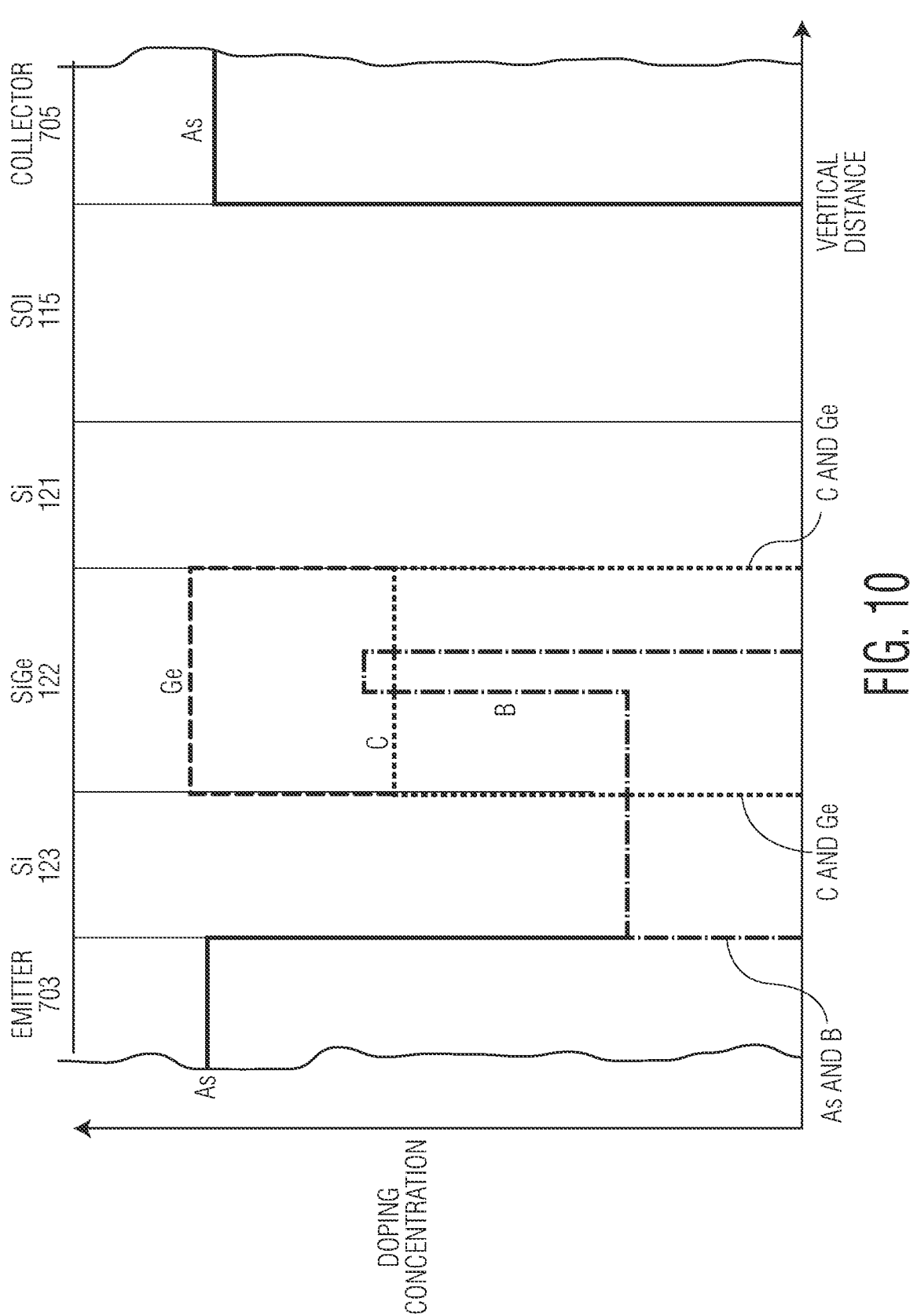
FIG. 10 shows doping profiles of layers of a transistor after formation according to one embodiment of the present invention.

FIG. 10 shows the doping profiles of the structures of FIG. 8 at layer formation. In the profile of FIG. 10, the horizontal axis represents the vertical distance of the structures of wafer 101 (from the bottom portion of emitter structure 703, silicon capping layer 123, SiGe layer 122, silicon layer 121, and SOI layer 115, to the top part of collector structure 705), and the vertical axis represents the concentrations of the different elements at locations along the horizontal axis according to one embodiment. As shown in FIG. 10, because structures 703 and 705 are formed of the same material, they have same doping concentration of N-type dopant arsenic (As) (e.g., $2 \, e^{20} \, cm^{-3}$). In addition to having a relatively high concentration of germanium (Ge), SiGe layer 122 is also doped with carbon when formed (e.g., at a concentration of $(1 \, e^{20} \, cm^{-3})$). In addition, the middle portion of SiGe layer 122 is formed with a high concentration $(1 \, e^{20} \, cm^{-3})$ of P-type dopant boron. The boron concentration at the upper portion of SiGe layer 122 and in layer 123 is at a lower concentration $(1 \, e^{18} \, cm^{-3})$.

Figure 11:
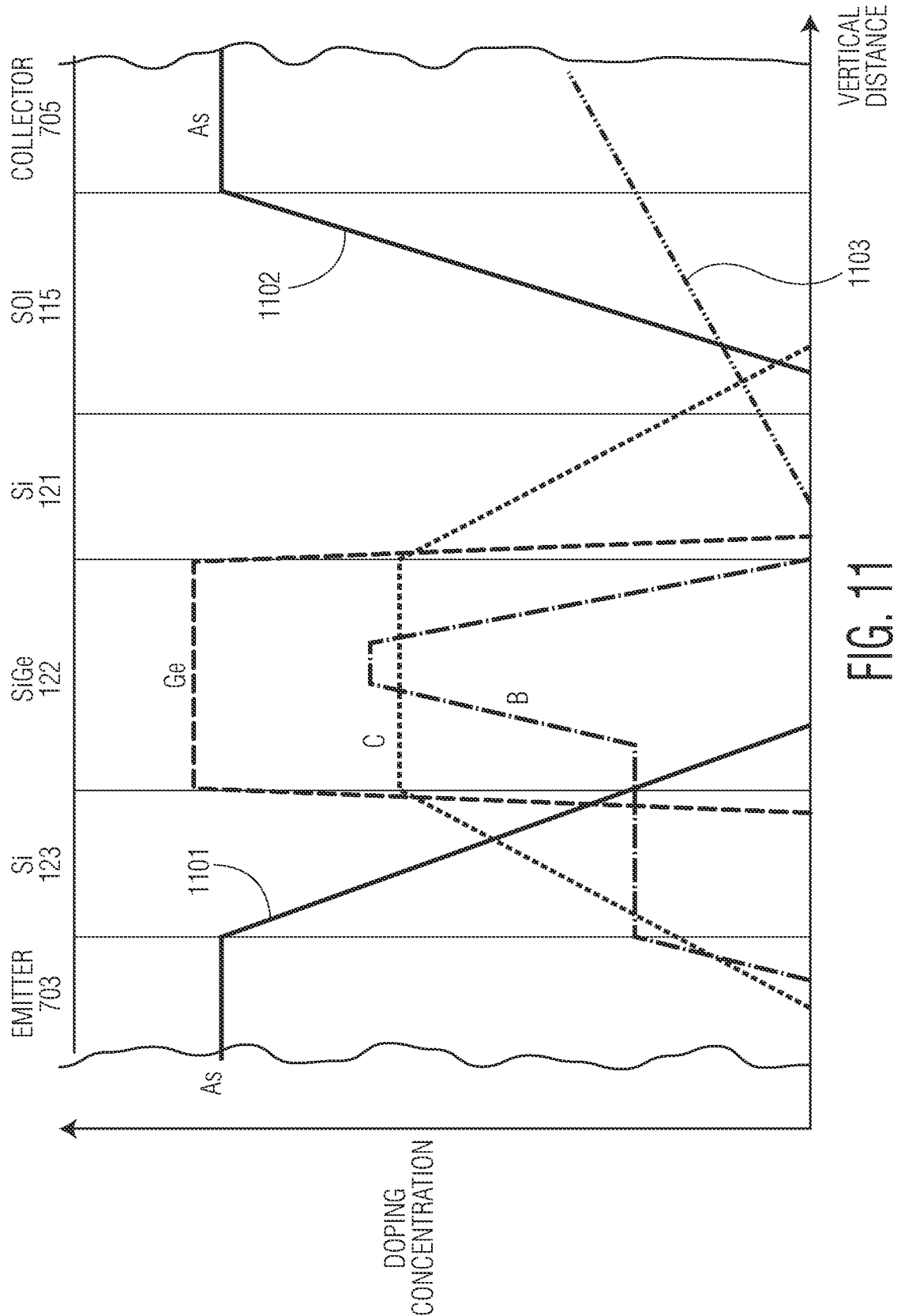
FIG. 11 shows doping profiles of layers of a transistor after dopant activation according to one embodiment of the present invention.

FIG. 11 shows the doping profiles after the annealing process for the same structures shown in FIG. 10. As compared with the doping profiles in FIG. 10, the doping profile transitions are not vertical, indicating that the dopants have diffused into different layers due to the high temperature anneal. As shown in FIG. 11, some carbon and germanium diffused out of layer 123. Boron also diffused into adjacent layers as well.

As shown in FIG. 11, the arsenic from structure 703 diffuses into layer 123 and slightly into SiGe layer 122. However, the slope of the arsenic transition profile portion 1101 from structure 703 is still relatively steep for effective transistor performance. Because structure 705 is formed during a same process and is of the same material as structure 703, the slope of the arsenic transition profile portion 1102 from structure 705 has the same magnitude as portion 1101.

If collector structure 705 were formed before base layer 111 (layers 121-123), then structure 705 would be subject to additional high temperature processes, which would cause the arsenic in structure 705 to further diffuse such that the arsenic transition profile of structure 705 would have a shallower slope (as shown by dashed line 1103). Accordingly, forming structure 705 after the formation of base layers 121-123 and after other processes (e.g., oxide, spacer, polysilicon, and nitride formation and rapid thermal anneal processes) may allow for the collector structure to have a steep dopant transition profile for improved transistor performance. For example, an oxide liner oxidation process in the formation of STI 107 may require process temperatures of around 1100 C.

In other embodiments, the transistor structures may have other doping profiles and/or other layer configurations. For example, in some embodiments, the doping profiles may be symmetrical from structure 703 to structure 705 across the intrinsic base. In such an embodiment, layer 121 may be removed and layer 115 may be thinned such that the distance of structure 703 to SiGe layer 122 is same as the distance from structure 705 to SiGe layer 122.

Referring back to FIG. 8, the processes described above with respect to FIGS. 1-8 result in two NPN HBT bipolar transistors 831 and 833. Transistor 831 includes an intrinsic base 835 doped with boron located in layer 111, an emitter doped with arsenic located in emitter structure 703, and a collector doped with arsenic located directly below intrinsic base 835 in collector structure 705. Transistor 833 includes an intrinsic base 837 doped with boron located in layer 111, an emitter doped with arsenic located in emitter structure 707, and a collector doped with arsenic located directly below intrinsic base 837 in collector structure 705. The collectors of transistors 831 and 833 are electrically connected together by collector structure 705.

After the stage of manufacture shown in FIG. 8, subsequent processes may be performed on wafer 101. For example, upper interconnect layers (not shown) may be formed on top of layer 801 and include conductive structures electrically coupled to the contacts for the collectors, emitters, and/or bases of the transistors of FIG. 8 as well as to the contacts of other devices formed on wafer 101 and to die terminals (e.g., bumps, pads, pillars—not shown). Afterwards, wafer 101 is singulated into multiple semiconductor die, each with at least one transistor pair similar to the transistor pair shown in FIG. 8. The die are then protected in semiconductor packages that can be implemented in electronic systems such as e.g., RF communications devices, motor controllers, automotive electronics systems, or cellular phones. In one example, the transistors are used as a power amplifier to amplify a received RF signal or to amplify an RF signal to be transmitted, for example, as used in a cellular telephone.

Transistors having other configurations may be formed by the processes described above. For example, referring back to FIG. 8, in one embodiment, the base contacts 812 and 814 may be located outside of the emitter contacts 811 and 815 instead of between the emitter contacts 811 and 815 and collector contact 813. In another embodiment, each transistor may include base contacts located on both sides of the emitter contacts. In still another embodiment, emitter structures 703 and 707 may be contiguous where they laterally surround collector structure 705 such that FIG. 8 shows one transistor. In such an embodiment, the base contacts would either surround collector structure 705 or surround both the collector and emitter structures. In other embodiments, each transistor would include its own collector structure which would be physically separated from the other collector structure. In still other embodiments, a deep isolation trench filled with a dielectric would be formed through the middle of structure 705 extending as deep as STI 107 to separate collector structure 705 into two collector structures, one for each transistor. In still other embodiments, the openings (203) to expose oxide layer 113 would be located around the emitter opening such that a collector structure would be formed to surround the emitter structure. In other embodiments, more than two emitter structures would be formed for each collector structure.

In one embodiment, the structures of FIG. 8 can be configured as a Darlington transistor where a base contact (e.g., 812) of one transistor is electrically connected to the emitter contact (e.g., 815) of the another transistor. In one embodiment, the electrical connection would be made in the interconnect layer above layer 801. In another embodiment, the electrical connection could be made in layer 801 outside of the cutaway view of FIG. 8. In other embodiments, the transistors of FIG. 8 could be configured as other types of devices having transistors with connected collectors.

Figure 9:
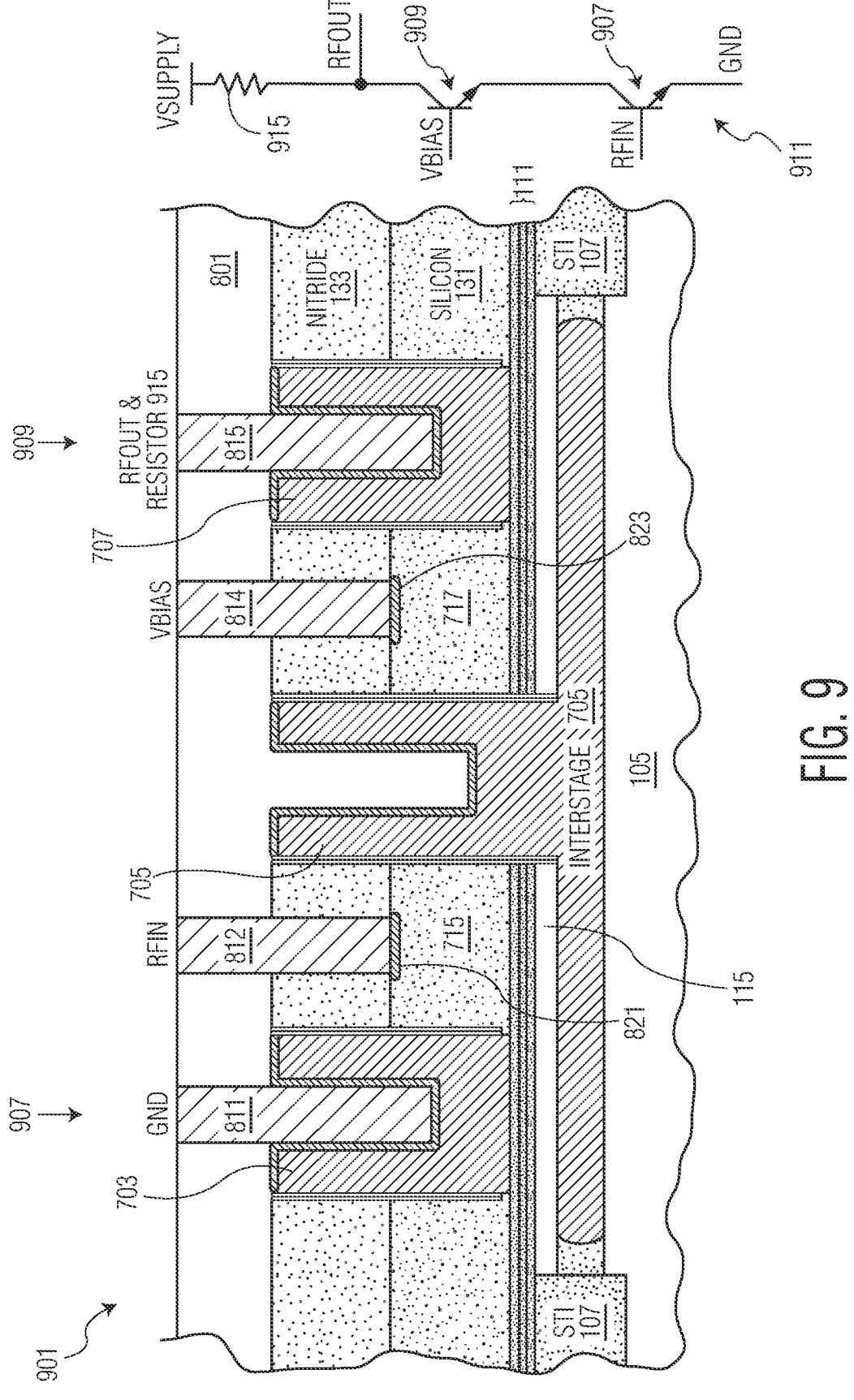
FIG. 9 is a partial cutaway side view of a wafer at a stage in the manufacture of a semiconductor device according to another embodiment of the present invention.

FIG. 9 is a partial cutaway side view of a wafer 901 according to one embodiment of the present invention. The reference numbers in FIG. 9 that are the same as in FIG. 8 indicate similar structures formed by similar methods.

In the embodiment of FIG. 9, the emitter of transistor 907 is located in structure 703 and the collector of transistor 907 is located in structure 705. In contrast, the emitter of transistor 909 is located in structure 705 and the collector of transistor 909 is located in structure 707. Structure 705 also serves as an interconnect between the collector of transistor 907 and the emitter of transistor 909. With the embodiment of FIG. 9, there is no contact to interconnect structure 705. However, other implementations of the configuration of FIG. 9 may include a contact for structure 705.

As shown in circuit diagram 911, transistors 907 and 909 can be implemented in a cascode configuration where the collector of one transistor (907) is electrically connected to the emitter of another transistor (909), such as with the cascoded amplifier in diagram 911. In the implementation of the amplifier of diagram 911, emitter contact 811 is connected to ground, base contact 812 is connected to receive an RF signal (RFIN) to be amplified, base contact 814 is connected to a bias source (VBIAS) for setting the gain of the amplifier, and collector contact 815 is connected to the output (RFOUT) and resistor 915. Structure 705 serves as an interstage electrical connector between transistor 907 and 909.

Accordingly, because the material of structures 703, 705, and 707 are formed during a same process and of the same semiconductor material, the doping profiles of the current electrode structures (e.g. structures 703 and 707) located above the intrinsic bases and the electrode structure (e.g. structure 705) located below the intrinsic bases can be similar such that either type of structure can be configured as an emitter or as a collector without a performance penalty due to an increased base-emitter capacitance. With some of these embodiments, the processes formed herein can be used to make cascoded devices such as that shown by diagram 911 that are more compact due to the reduction of contacts for two current electrodes.

As described above, forming a current electrode structure with current electrode dopants directly below a base layer after the formation of the base layer reduces the exposure of the current electrode structure to high temperature processes which could cause unwanted diffusion of the current electrode dopants leading to the reduced steepness of the current-electrode dopant transition profile. By reducing unwanted diffusion, transistor switching times can be improved. Also, the probability of avalanche current or reduced voltage breakdown can be reduced.

Furthermore, forming the current electrodes during a same process with the same semiconductor material may allow for a more uniform transistor device where both structures operate at a similar efficiency. Consequently, there would be no mismatch in dopant transition profiles which could reduce transistor efficiency based on the current electrode structure with the lower dopant transition profile steepness. In addition, forming the current electrodes during a same process with the same semiconductor material may provide for the ability to interchange current electrode functions thereby allowing for a structure to function either as a collector or emitter depending upon the circuit configuration. The flexibility provided by such an ability may result in a more efficient circuit layout.

The transistors described herein may have other configurations, have other structures, be made of other materials, and/or may be made by other processes. For example, FIGS. 8 and 9 each show NPN bipolar transistors. However, other types of transistors may be made by the processes described herein. For example, PNP transistors may be formed where the collectors and emitters have a net P-type conductivity doping and the base has a net N-type conductivity doping.

As disclosed herein, a first structure is "directly over" a second structure if the first structure is located over the second structure in a line having a direction that is perpendicular with a generally planar major side of the wafer or substrate. For example, in FIG. 8, contact 812 is directly over layer 111. Contact 813 is not directly over layer 111. As disclosed herein, a first structure is "directly beneath" or "directly under" a second structure if the first structure is located beneath the second structure in a line having a direction that is perpendicular with a generally planar major side of the wafer or substrate. For example, in FIG. 8, STI 107 is directly beneath nitride layer 133. STI 107 is not directly beneath contact 814. One structure is "directly between" two other structures in a line if the two structures are located on opposite sides of the one structure in the line. For example, in FIG. 8, contact 813 is located directly between contacts 812 and 814 in a line in the cut away side view of FIG. 8. Layer 111 is not located directly between contacts 811 and 814. A first structure is "directly lateral" to a second structure if the first structure and second structure are located in a line having a direction that is parallel with a generally planar major side of the wafer or substrate. For example, emitter contact 811 and base contact 812 are directly lateral to each other. One structure is "directly laterally between" two other structures if the two structures are located on opposite sides of the one structure in a line that is parallel with a generally planar major side of the wafer or substrate. For example, in FIG. 8, contact 813 is located directly laterally between base contact 812 and emitter contact 815. A surface is at a "higher elevation" than another surface, if that surface is located closer to the top of the active side of a wafer or die in a line having a direction that is perpendicular with the generally planar major side of the wafer or die. In the views of FIGS. 1-9, the active side of the wafer is the top side of the Figures. For example, contact 812 is at a higher elevation than layer 115.

An intrinsic base is a region of a bipolar transistor of a net opposite conductivity doping of the emitter and collector and where carriers flow between the emitter and the collector in response to carrier flow into the intrinsic base. A collector and an emitter are current electrodes of a bipolar transistor.

Features specifically shown or described with respect to one embodiment set forth herein may be implemented in other embodiments set forth herein. For example, the specific sealing processes disclosed with respect to one embodiment, may be implemented in another embodiment.

One embodiment includes method for forming a transistor. The method includes removing sacrificial material located directly under a first semiconductor layer in a first area to form a cavity. The first semiconductor layer includes conductivity dopants being of a first conductivity type. The conductivity dopants of the first semiconductor layer in the first area provide conductivity dopants for an intrinsic base of a transistor in the first area. At least a portion of an intrinsic base of the transistor is located in the first semiconductor layer in the first area. The method includes after the removing the sacrificial material, forming a second semiconductor material in the cavity. The second semiconductor material including conductivity dopants of a second conductivity type opposite the first conductivity type. The conductivity dopants of the second semiconductor type of the second semiconductor material formed in the cavity provide dopants for a first current electrode of the transistor. At least a portion of the first current electrode is located in the second semiconductor material formed in the cavity directly below the intrinsic base.

Another embodiment includes a method for forming a transistor. The method includes removing sacrificial material located directly under a first semiconductor layer of a wafer in a first area to form a cavity. The first semiconductor layer includes conductivity dopants being of a first conductivity type. The conductivity dopants of the first semiconductor layer in the first area provide conductivity dopants for an intrinsic base of a transistor, At least a portion of an intrinsic base of the transistor is located in the first semiconductor layer in the first area. The method includes after the removing the sacrificial material, forming a second semiconductor material in the cavity directly under the first area of the first semiconductor layer and directly over the first area of the first semiconductor layer. The second semiconductor material including conductivity dopants of a second conductivity type opposite the first conductivity type. The conductivity dopants of the second semiconductor type of the second semiconductor material formed in the cavity provide dopants for a first current electrode of the transistor. At least a portion of the first current electrode is located in the second semiconductor material formed in a cavity directly below the intrinsic base. The conductivity dopants of the second semiconductor type of the second semiconductor material formed directly over the first area of first semiconductor layer provide dopants for a second current electrode of the transistor. At least a portion of the second current electrode is located in the second semiconductor material formed directly over the intrinsic base.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor, the method comprising:

removing sacrificial material located directly under a first semiconductor layer in a first area to form a cavity, wherein the first semiconductor layer includes conductivity dopants being of a first conductivity type, wherein the conductivity dopants of the first semiconductor layer in the first area provide conductivity dopants for an intrinsic base of a transistor in the first area, wherein at least a portion of an intrinsic base of the transistor is located in the first semiconductor layer in the first area;

after the removing the sacrificial material, forming a second semiconductor material in the cavity, the second semiconductor material including conductivity dopants of a second conductivity type opposite the first conductivity type, wherein the conductivity dopants of the second semiconductor type of the second semiconductor material formed in the cavity provide dopants for a first current electrode of the transistor, wherein at least a portion of the first current electrode is located in the second semiconductor material formed in the cavity directly below the intrinsic base.

2. The method of claim 1 further comprising, after the removing the sacrificial material, forming the second semiconductor material directly over the first semiconductor layer, wherein the second semiconductor material formed directly over the first semiconductor layer includes conductivity dopants of the second conductivity type, wherein the conductivity dopants of the second semiconductor type of the second semiconductor material formed directly over the first semiconductor layer provide dopants for a second current electrode of the transistor, wherein at least a portion of the second current electrode is located in the second semiconductor material formed directly over the intrinsic base.

3. The method of claim 2 wherein the forming the second semiconductor material in the cavity and the forming the second semiconductor material directly over the first semiconductor layer are performed during a same semiconductor forming process.

4. The method of claim 3 wherein the same semiconductor forming process is characterized as an epitaxial process.

5. The method of claim 3 wherein after the performance of the same semiconductor process, the second semiconductor material formed in the cavity directly under the first semiconductor layer in the first area and the second semiconductor material formed directly over the first semiconductor layer in the first area are contiguous, the method further comprising physically separating the second semiconductor material formed in the cavity directly under the first semiconductor layer in the first area from the second semiconductor material formed directly over the first semiconductor layer in the first area into non-contiguous portions.

6. The method of claim 5 wherein the physically separating includes a wafer planarization process to remove portions of the second semiconductor material physically joining the second semiconductor material formed in the cavity directly under the first semiconductor layer in the first area and the second semiconductor material formed directly over the first semiconductor layer in the first area.

7. The method of claim 5 wherein after the physically separating, siliciding a portion of the second semiconductor material contiguous with the second semiconductor material formed in the cavity directly under the first semiconductor layer in the first area and siliciding a portion of the second semiconductor material contiguous with the second semiconductor material formed directly over the first semiconductor layer in the first area.

8. The method of claim 2 wherein the first current electrode is characterized as a collector and the second current electrode is characterized as an emitter.

9. The method of claim 2 wherein the first current electrode is characterized as an emitter and the second current electrode is characterized as a collector.

10. The method of claim 2 wherein a base semiconductor layer is located directly over the first semiconductor layer, the method includes forming a first opening in the base semiconductor layer directly over the first area, wherein the second semiconductor material formed directly over the first semiconductor layer in the first area is formed in the opening, wherein the method includes forming a second opening in the base semiconductor concurrently with forming the first opening, wherein the sacrificial material is removed by performing an isotropic etch of the sacrificial material though the first opening.

11. The method of claim 1 wherein first semiconductor layer includes silicon germanium and the second semiconductor material includes silicon.

12. The method of claim 1 wherein:

the removing sacrificial material includes removing sacrificial material located directly under the first semiconductor layer in a second area, wherein conductivity dopants of the first semiconductor layer in the second area provide conductivity dopants for an intrinsic base of a second transistor in the second area, wherein at least a portion of the intrinsic base of the second transistor is located in the first semiconductor layer in the second area;

the conductivity dopants of the second semiconductor type of the second semiconductor material formed in the cavity provide dopants for a first current electrode of the second transistor, wherein at least a portion of the first current electrode of the second transistor is located in the second semiconductor material formed in the cavity directly below the intrinsic base of the second transistor.

13. The method of claim 12 wherein the second semiconductor material formed in the cavity directly under the first semiconductor layer in first area is contiguous with the second semiconductor material formed in the cavity directly under the first semiconductor layer of the second area after singulation of the wafer into multiple semiconductor die.

14. The method of claim 12 wherein the first current electrode of the first transistor is characterized as a collector and the first current electrode of second transistor is characterized as an emitter.

15. The method of claim 12 further comprising;

after the removing the sacrificial material, forming the second semiconductor material directly over the first semiconductor layer, wherein the second semiconductor material formed directly over the first semiconductor layer includes conductivity dopants of the second conductivity type, wherein the conductivity dopants of the second semiconductor type of the second semiconductor material formed directly over the first semiconductor layer provide dopants for a second current electrode of the transistor, wherein at least a portion of the second current electrode is located in the second semiconductor material formed directly over the intrinsic base;

wherein the forming the second semiconductor material directly over the first semiconductor layer includes forming the second semiconductor material directly over the first semiconductor layer in the second area, wherein the conductivity dopants of the second semiconductor type of the second semiconductor material formed directly over the first semiconductor layer in the second area provide dopants for a second current electrode of the second transistor, wherein at least a portion of the second current electrode of the second transistor is located in the second semiconductor material formed directly over the intrinsic base of the second transistor.

16. The method of claim 1 further comprising:

forming an opening in the first semiconductor layer, wherein the sacrificial layer is removed by performing an isotropic etch of the sacrificial material though the opening;

forming a contact for the first current electrode of the first transistor, wherein a portion of the second semiconductor material located in the opening in the first semiconductor layer electrically couples the first current electrode of the first transistor with the contact.

17. The method of claim 1 wherein the sacrificial material is characterized as oxide of a buried oxide layer.

18. A method for forming a transistor, the method comprising:

removing sacrificial material located directly under a first semiconductor layer of a wafer in a first area to form a cavity, the first semiconductor layer includes conductivity dopants being of a first conductivity type, wherein the conductivity dopants of the first semiconductor layer in the first area provide conductivity dopants for an intrinsic base of a transistor, wherein at least a portion of an intrinsic base of the transistor is located in the first semiconductor layer in the first area;

after the removing the sacrificial material, forming a second semiconductor material in the cavity directly under the first area of the first semiconductor layer and directly over the first area of the first semiconductor layer, the second semiconductor material including conductivity dopants of a second conductivity type opposite the first conductivity type, wherein:

the conductivity dopants of the second semiconductor type of the second semiconductor material formed in the cavity provide dopants for a first current electrode of the transistor, wherein at least a portion of the first current electrode is located in the second semiconductor material formed in a cavity directly below the intrinsic base;

the conductivity dopants of the second semiconductor type of the second semiconductor material formed directly over the first area of first semiconductor layer provide dopants for a second current electrode of the transistor, wherein at least a portion of the second current electrode is located in the second semiconductor material formed directly over the intrinsic base.

19. The method of claim 18 wherein as a result of the forming a second semiconductor material, the second semiconductor material formed in the cavity directly under the first area of the first semiconductor layer and the second semiconductor material formed directly over the first area of the first semiconductor layer are contiguous, the method further comprising physically separating by planarization of the wafer, the second semiconductor material formed in the cavity directly under the first area of the first semiconductor layer from the second semiconductor material formed directly over the first area of the first semiconductor layer into non-contiguous portions.

20. The method of claim 18 wherein the first transistor is characterized as a as heterojunction bipolar transistor.

* * * * *